United States Patent
Yi

(10) Patent No.: US 11,502,119 B2
(45) Date of Patent: Nov. 15, 2022

(54) RADIATION-RESISTANT IMAGE SENSOR PACKAGE

(71) Applicant: Sensohub Co., Ltd., Anyang (KR)

(72) Inventor: Jeong-Hyong Yi, Gunpo (KR)

(*) Notice: Subject to any disclaimer, the term of this patent is extended or adjusted under 35 U.S.C. 154(b) by 31 days.

(21) Appl. No.: 17/128,011

(22) Filed: Dec. 19, 2020

(65) Prior Publication Data

US 2021/0202557 A1    Jul. 1, 2021

(51) Int. Cl.
*H01L 27/146* (2006.01)
*H01L 23/552* (2006.01)

(52) U.S. Cl.
CPC ...... *H01L 27/14625* (2013.01); *H01L 23/552* (2013.01); *H01L 27/14632* (2013.01); *H01L 27/1462* (2013.01)

(58) Field of Classification Search
CPC ............ H01L 27/14625; H01L 23/552; H01L 27/14632; H01L 27/1462; H01L 2224/04042; H01L 2224/32245; H01L 2224/48227; H01L 2224/73265; H01L 2924/15312; H01L 27/14618
See application file for complete search history.

(56) References Cited

U.S. PATENT DOCUMENTS 9,799,692 B2 * 10/2017 Iwafuchi ............. H01L 27/1462
2016/0304730 A1 * 10/2016 Hitomi ..................... H01L 27/14
2018/0292266 A1 * 10/2018 Slater ..................... G01J 3/4406

* cited by examiner

*Primary Examiner* — Jonathan Han

(57) ABSTRACT

A radiation-resistant image sensor package may include: a substrate; an image sensor disposed over the substrate; and an optical cover disposed over the image sensor, wherein a radiation-resistant passivation layer is coupled to the optical cover.

15 Claims, 7 Drawing Sheets

Cosmic ray or high energy particles

RADIATION-RESISTANT IMAGE SENSOR PACKAGE

CROSS-REFERENCE TO RELATED APPLICATIONS

This application claims priority to Korean Patent Application No. 10-2019-0177166, filed on Dec. 27, 2019, which is hereby incorporated by reference in its entirety into the present application.

BACKGROUND

Technical Field

The present disclosure relates to an image sensor package, and more particularly, to a radiation-resistant image sensor package.

Related Art

An image sensor which is fabricated through a silicon semiconductor process in order to acquire an image is widely used in various fields such as a mobile device, a satellite and space observation. In general, a silicon semiconductor device including an image sensor is fabricated through a silicon wafer process. In such a silicon wafer process, individual devices which are generally arranged in an M×N matrix and typically referred to as "dies" are made in each wafer fabricated through a predetermined semiconductor process for each of the devices. Then, the dies having passed through a predetermined electrical characteristic test at a wafer level are separated into individual pieces, housed in a dedicated structure typically referred to as a package, and completed as one semiconductor device.

Typically, a structure referred to as a package serves to protect silicon semiconductor dies, sealed and housed in the internal space thereof, from an external impact or contamination, supply an input signal and power to a semiconductor chip therein through a metal lead wire or metal pin, and transfer an output signal obtained from the semiconductor chip to an external device.

For this purpose, ceramic or plastic is mainly used as a semiconductor device package material, and an image sensor is a semiconductor device that converts a light signal into an electrical signal, and thus has transparent glass as a lid on the top surface of the package, unlike a general semiconductor device.

It is known that the characteristics of an image sensor chip used to acquire an image in a space environment such as a satellite or an image sensor chip mounted in a camera for monitoring the inside of a nuclear power plant are degraded by radiation.

Furthermore, it is known that the reason why the characteristic of a silicon semiconductor chip is degraded by radiation is because high energy ions or particles of the radiation penetrate into the silicon semiconductor chip and are accumulated in a gate dielectric layer of a transistor which is the base of a circuit configuration or cause a defect to silicon single crystal.

A silicon semiconductor image sensor chip structure includes a conventional CCD (Charge-Coupled Device) structure and a CMOS (Complementary Metal-Oxide-Semiconductor) structure to which much attention has been recently paid. Since the CMOS structure uses more transistors than the CCD structure, the CMOS structure is further affected by radiation. However, the CMOS structure has a low driving voltage, is fabricated through a simple process, and generates a small amount of heat. Thus, the image sensor chip market is being rapidly changed from the CCD structure to the CMOS structure.

SUMMARY

Various embodiments are directed to a radiation-resistant image sensor package which can house a silicon semiconductor chip therein, and not only adopt radiation-resistant design and process technology, but also minimize degradation by radiation, such that the silicon semiconductor chip is used in a high radiation environment.

The purposes of the present disclosure are not limited to the above-described purposes, and other purposes and advantages of the present disclosure, which are not described herein, will be understood by the following descriptions, and more clearly understood by embodiments of the present disclosure. Furthermore, it can be easily seen that the purposes and advantages of the present disclosure can be realized by units described in claims and combinations thereof.

In an embodiment, a radiation-resistant image sensor package may include: a substrate; an image sensor disposed over the substrate; and an optical cover disposed over the image sensor, wherein a radiation-resistant passivation layer is coupled to the optical cover.

In an embodiment, a semiconductor chip package having an internal space for housing a semiconductor chip may include an optical cover disposed over the semiconductor chip and configured to transmit light while sealing the internal space, wherein the optical cover includes a first region which includes a material for preventing the influence of radiation and a second region which does not include the material.

In accordance with embodiments of the present disclosure, the radiation-resistant package structure may include the radiation-resistant passivation layer disposed outside the light receiving pixel region, and effectively protect only a transistor region which is significantly affected, without damaging the image characteristic of the image sensor.

DETAILED DESCRIPTION

Figure 1:
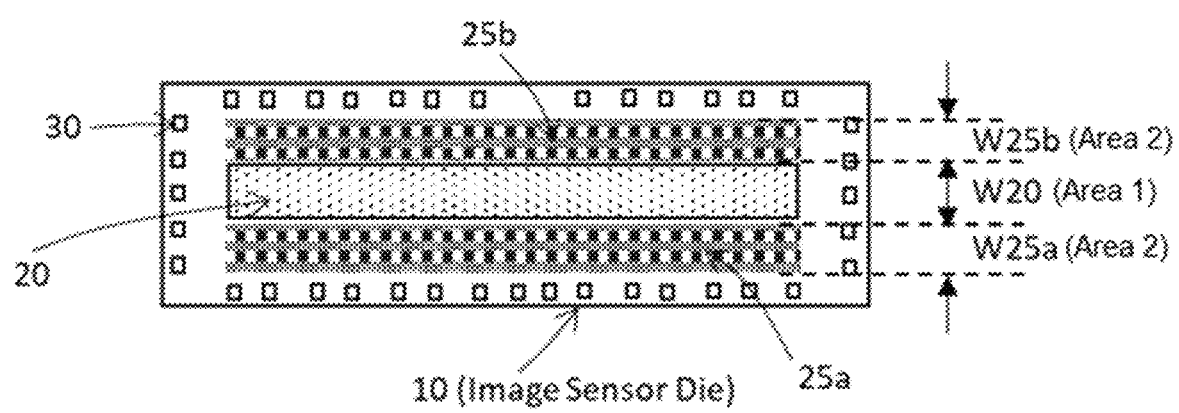
FIG. 1 is a diagram illustrating a schematic configuration of a silicon semiconductor image sensor chip in accordance with an embodiment of the present disclosure.

The above-described purposes, features and advantages will be described in detail with reference to the accompanying drawings. Thus, the technical idea of the present disclosure can be easily carried out by those skilled in the art to which the present disclosure pertains. Moreover, in describing the present disclosure, detailed descriptions on publicly known technologies will be ruled out in order not to unnecessarily obscure subject matters of the present disclosure. Hereafter, various embodiments will be described in detail with reference to the accompanying drawings. In the drawings, like reference numerals represent the same or similar components.

Throughout the specification, when one element is referred to as being "connected to" or "coupled to" another element, it may indicate that the former element is "directly connected" or "directly coupled to" the latter element or the former element is "connected" or "coupled" to the latter element with another element interposed therebetween. Furthermore, when an element "includes" or "has" a component, it may indicate that the element does not exclude another component unless referred to the contrary, but can further include another component. In addition, the terms of a singular form may include plural forms unless referred to the contrary.

FIG. 1 is a plan view schematically illustrating a configuration of an image sensor 10 in accordance with an embodiment of the present disclosure. The image sensor 10 may roughly include a light receiving pixel region 20, a peripheral circuit region 25 including peripheral circuit regions 25a and 25b, and a plurality of pads 30 for connecting a metal wire for electrical connection to the outside of a package. FIG. 1 illustrates a linear image sensor having a length larger than the width thereof, and the image sensor 10 may include the light receiving pixel region 20 having a width W20 and the peripheral circuit regions 25a and 25b having widths W25a and W25b, respectively, and formed outside the light receiving pixel region 20. According to the purpose of use of the image sensor, the peripheral circuit region 25 may be disposed only on one side of the light receiving pixel region 20.

The light receiving pixel region 20 in accordance with one embodiment of the present disclosure indicates a region in which pixels fabricated as CCD or CMOS image sensors are repeatedly arranged, in order to generate an electrical signal such as a charge or voltage value from incident light. For example, the light receiving pixel region 20 may a region in which pixels configured as CCD or CMOS image sensors are repeatedly arranged in an M×N 2D matrix.

The peripheral circuit region 25 in accordance with one embodiment of the present disclosure may include peripheral circuits for generating an image sensor by processing an electrical signal generated in the light receiving pixel region 20. For example, the peripheral circuit region 25 may include an amplifier, an analog-digital converter, a buffer, a compensator, a controller and the like, which are fabricated as CMOS devices.

Figure 2A:
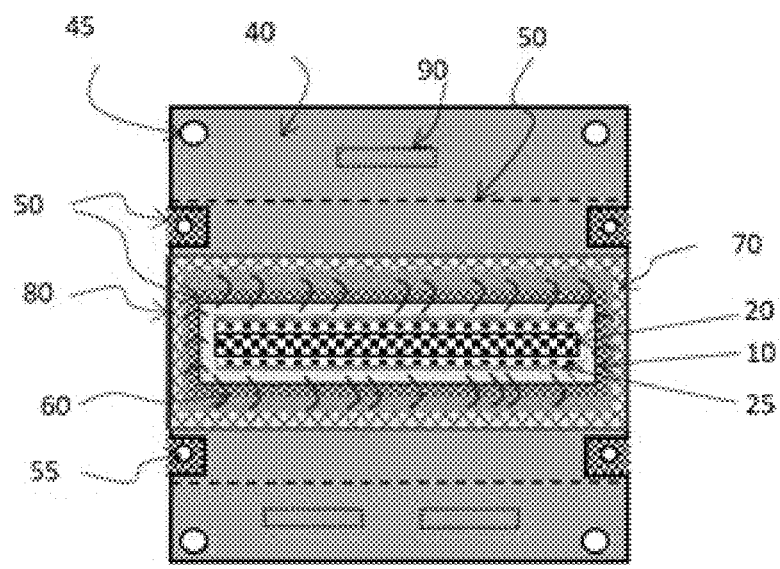
FIGS. 2A and 2B are plan views schematically illustrating a PCB (Printed Circuit Board) and an image sensor package formed of ceramic in accordance with one embodiment of the present disclosure, respectively.
Figure 2B:
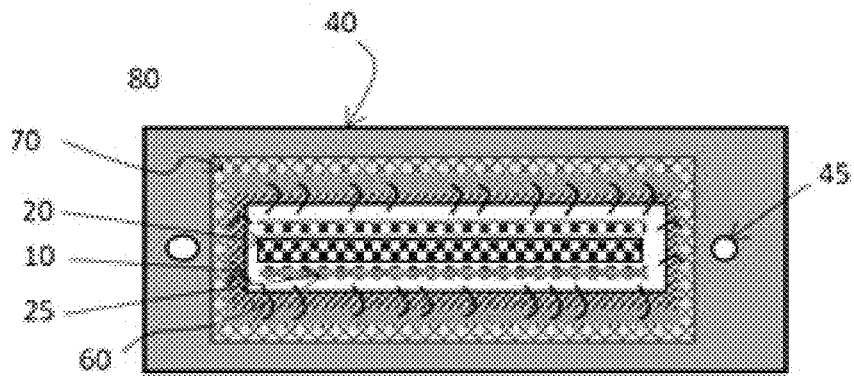

FIGS. 2A and 2B are plan views illustrating a package structure for housing an image sensor chip therein. FIG. 2A illustrates a PCB package structure, and FIG. 2B illustrates a ceramic package structure. Referring to FIGS. 2A and 2B, the image sensor 10 disposed in the internal space of the package may include the light receiving pixel region 20 and the peripheral circuit region 25, and a package body 40 may be configured as a PCB or formed of ceramic. In accordance with one embodiment of the present disclosure, the package body may have a through-hole 45 for fixing the package to another device, and the package and the silicon semiconductor image sensor chip may be electrically connected to each other through a plurality of metal wires 60.

Furthermore, an optical cover 80 (for example, optical glass) may be attached to the top of the package such that light can reach the light receiving pixel region of the image sensor chip, and the optical cover 80 and the package body 40 may be bonded to each other with a support body 70 interposed therebetween. The optical cover 80 in accordance with one embodiment of the present disclosure may serve to protect the image sensor 10 from an external pollution source while enabling a camera device to transmit a light signal in a desired wavelength region through a lens at the top of the camera device. For example, the optical cover 80 may be formed of optical glass. Typically, the optical glass 80 may serve to manage transmittance, and anti-reflection coating may be applied to the surface of the optical glass 80 in order to suppress reflection from the surface of the glass.

Furthermore, the support body 70 in accordance with one embodiment of the present disclosure may secure the height of the optical glass 80, such that the metal wires 60 are not contacted with the optical glass 80 when the metal wires 60 are installed. In accordance with one embodiment of the present disclosure, the support body 70 may be formed of epoxy resin or phenol resin having a similar thermal expansion coefficient to a PCB, which makes it possible to prevent undesired deformation in the optical glass 80 and the PCB adjacent thereto, for example, distortion, which may occur when the support body 70 has a different thermal expansion coefficient from the PCB.

Figure 3:
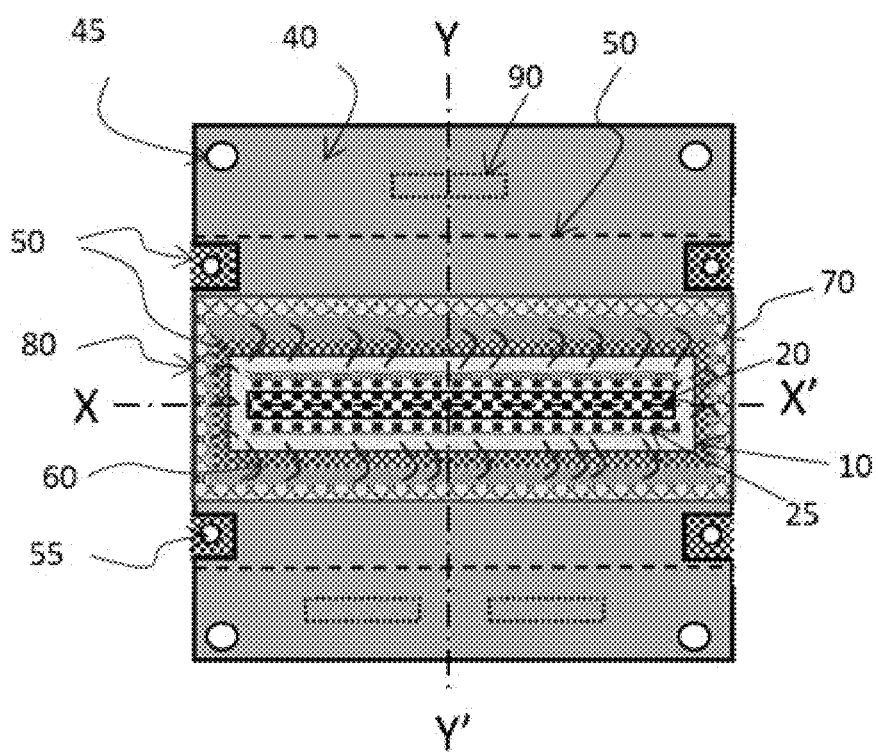
FIG. 3 is a diagram schematically illustrating an image sensor package using a PCB in accordance with an embodiment of the present disclosure.

FIG. 3 is a plan view obtained by adding a horizontal cutting line X-X' and a vertical cutting line Y-Y' to FIG. 2A which is a plan view of the image sensor package in accordance with one embodiment of the present disclosure. For convenience of description, an example of a package structure using a PCB will be described with reference to FIGS. 4 to 6 which are cross-sectional views taken along the cutting lines.

Typically, the image sensor package using a PCB 40 in accordance with one embodiment of the present disclosure may have a COB (Chip-On-Board) structure, and a substrate 50 may be formed of a metal having excellent thermal conductivity in order to radiate heat from the image sensor. The substrate 50 may have a hole 55 matched with a cut-out of the PCB 40. Thus, the substrate 50 may be easily coupled to the PCB 40. In an embodiment of the present disclosure, the substrate 50 may be connected through a connector 90 with another PCB for driving the image sensor, instead of a metal pin for processing a signal, unlike the ceramic package structure.

Figure 4:
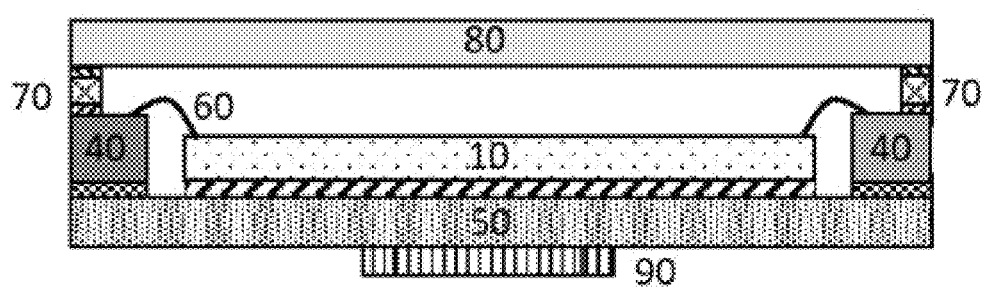
FIG. 4 is a cross-sectional view schematically illustrating an image sensor package in accordance with an embodiment of the present disclosure.

FIG. 4 is a cross-sectional view taken along the cutting line X-X' of FIG. 3. The image sensor package may include the optical glass 80, the optical glass support body 70, the PCB 40 serving as a package body, the bottom substrate 50 and the connector 90. In accordance with one embodiment of the present disclosure, the image sensor chip 10 may be disposed on the bottom substrate 50, and the image sensor chip 10 and the package body 40 may be connected to each other through the metal wires 60. Furthermore, the optical glass 80 and the optical glass support body 70, the optical glass support body 70 and the package body 40, the package body 40 and the bottom substrate 50, and the bottom substrate 50 and the silicon semiconductor image sensor chip 10 may be fixed to each other through a predetermined adhesive (for example, plastic resin such as thermosetting epoxy resin).

Figure 5:
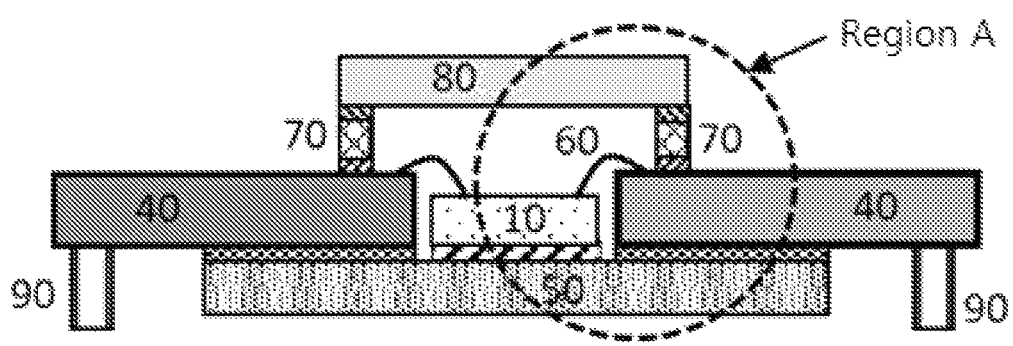
FIG. 5 is a cross-sectional view schematically illustrating an image sensor package in accordance with an embodiment of the present disclosure.

FIG. 5 is a cross-sectional view taken along the cutting line Y-Y' of FIG. 3, and the descriptions of components in FIG. 5 are the same as those in FIG. 4.

Figure 6:
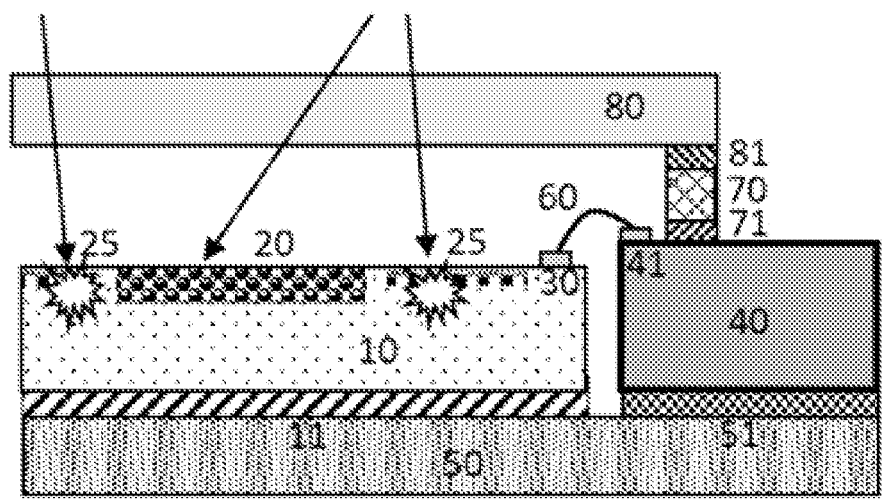
FIG. 6 is an expanded view of a portion of the image sensor package in accordance with one embodiment of the present disclosure.

FIG. 6 is an expanded view of a region A in FIG. 5, and illustrates a damaged region affected by radiation. The bottom substrate 50 and the silicon semiconductor image sensor 10 may be bonded to each other through an adhesive 11 such as plastic resin (for example, thermosetting epoxy resin), and the bottom substrate 50 and the PCB 40 serving as a package body may be fixed through another adhesive 51 such as plastic resin. The package body 40 and the optical glass support body 70 may be bonded to each other through an adhesive 71 such as plastic resin, and the optical glass support body 70 and the optical glass 80 may be bonded to each other through an adhesive 81 such as plastic resin. However, the coupling between the components in accordance with one embodiment of the present disclosure is not limited to the method disclosed above, and a proper method may be selected among mechanical, physical and chemical methods in the art to which the present disclosure pertains. Pads 30 and 41 which are provided on the image sensor 10 and the package body 40, respectively, may be electrically connected to each other through the metal wire 60.

Referring to the cross-section of the image sensor chip, the light receiving pixel region 20 may be disposed in a predetermined region of the silicon substrate, and the peripheral circuit region 25 may be disposed outside the light receiving pixel region. When a package having an image sensor housed therein is used in an environment where high radiations are present, high energy radiations (alpha particles, beta particles and gamma rays) having passed through the optical glass 80 transfer an energy impact to the silicon semiconductor chip, and ions generated at the time are mainly accumulated in a gate oxide layer of a MOS transistor, and cause a change in device characteristic. Furthermore, as silicon atoms are separated from silicon single crystal, a leakage current is increased to degrade the device characteristic. It is known that particles included in cosmic rays having higher energy may change information stored in a transistor or cut a circuit line. Furthermore, it is known that such semiconductor chip damage occurs more easily in the peripheral circuit region 25 having a transistor structure with a gate oxide layer than in the light receiving pixel region 20 having an optical diode structure. Therefore, in order to use an image sensor during a predetermined lifetime or more in an environment where high radiation is present, the image sensor needs to be protected from the radiation.

Hereafter, the structure of the image sensor package in accordance with one embodiment of the present disclosure will be described with reference to FIGS. 7 to 11.

Figure 7:
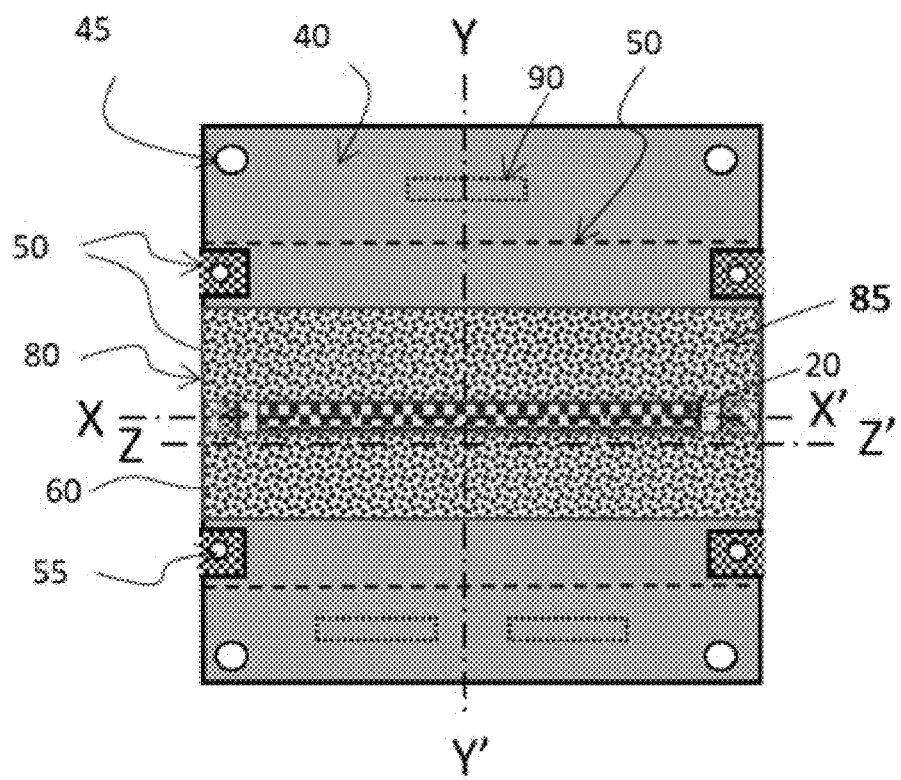
FIG. 7 is a diagram schematically illustrating an image sensor package using a PCB in accordance with an embodiment of the present disclosure.

FIG. 7 illustrates that a predetermined region of the bottom of the optical glass 80 is coated with a passivation layer 85 formed of a radiation-resistant material. More specifically, the region of the bottom of the optical glass 80, except an area corresponding to the light receiving pixel region 20 of the image sensor, may be coated. The package structure in accordance with one embodiment of the present disclosure will be described with reference to FIGS. 8 to 11 which are taken along a horizontal cutting line X-X', a vertical cutting line Y-Y' and a horizontal cutting line Z-Z' from the plan view of FIG. 7. The horizontal cutting line X-X' passes the top of the light receiving pixel region 20, and the horizontal cutting line Z-Z' passes the peripheral circuit region 25 of the image sensor chip.

Figure 8:
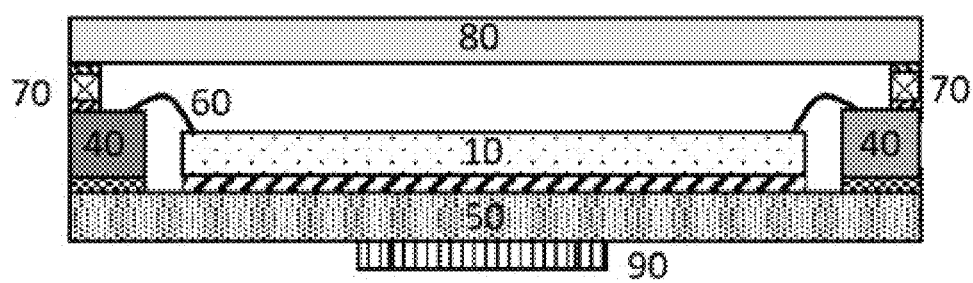
FIG. 8 is a cross-sectional view schematically illustrating an image sensor package in accordance with an embodiment of the present disclosure.

FIG. 8 is a cross-sectional view taken along the cutting line X-X' passing the top of the light receiving pixel region 20 illustrated in FIG. 7, and the cross-section taken along the cutting line has a cross-sectional structure similar to FIG. 4. However, although not illustrated in FIG. 8, the passivation layer 85 formed of radiation-resistant material is attached to the bottom of the optical glass 80.

Figure 9:
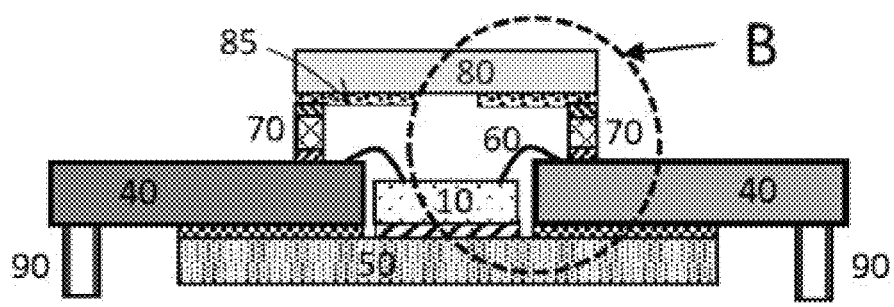
FIG. 9 is a cross-sectional view schematically illustrating an image sensor package in accordance with an embodiment of the present disclosure.

FIG. 9 is a cross-sectional view taken along the cutting line Y-Y' of FIG. 7, illustrating that the radiation-resistant passivation layer 85 is added to the bottom of the optical glass 80. The other reference numerals represent the same components as those in FIG. 5.

Figure 10:
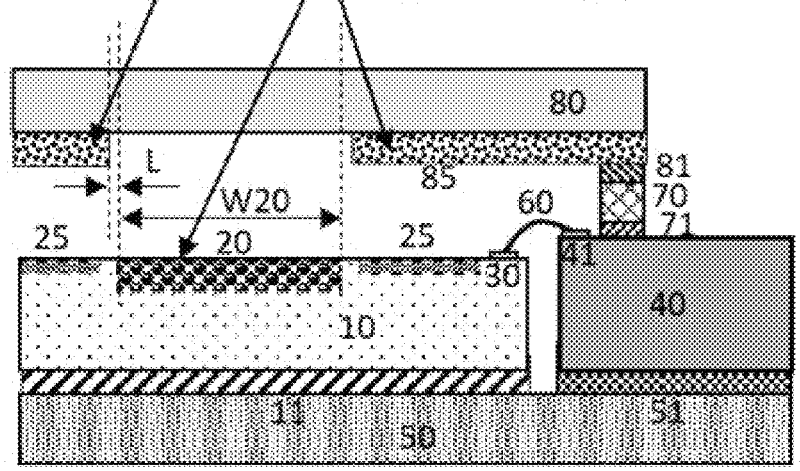
FIG. 10 is an expanded view of a portion of the image sensor package in accordance with one embodiment of the present disclosure.

FIG. 10 is an expanded view of a region B of FIG. 9, illustrating that the radiation-resistant passivation layer 85 is added to the bottom of the optical glass 80. In accordance with one embodiment of the present disclosure, a minimum gap L of more than 0 may be designed between an end of the radiation-resistant passivation layer 85 added to the bottom of the optical glass 80 and an end of the light receiving pixel region 20 of the image sensor chip, such that the radiation-resistant passivation layer 85 does not invade at least the light receiving pixel region 20 of the image sensor chip. In accordance with another embodiment of the present disclosure, the end of the passivation layer 85 and the end of the light receiving pixel region 20 of the image sensor chip may be positioned on the same vertical line.

As illustrated in FIG. 9, the image sensor package structure in accordance with one embodiment of the present disclosure may be implemented as a radiation-resistant structure, except the influence of radiation which is obliquely incident on the top of the image sensor chip.

Figure 11:
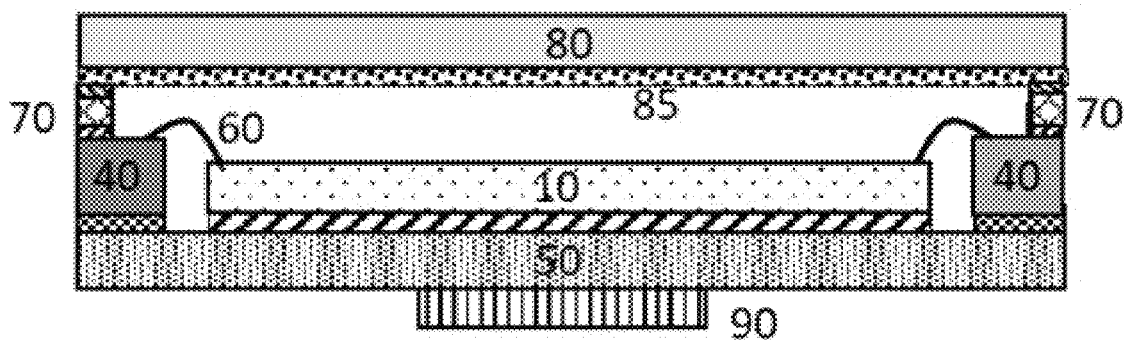
FIG. 11 is a cross-sectional view schematically illustrating an image sensor package in accordance with an embodiment of the present disclosure.

FIG. 11 is a cross-sectional view taken along the cutting line Z-Z' corresponding to the peripheral circuit region 25 of the image sensor in FIG. 7, illustrating that the radiation-resistant passivation layer 85 is provided on the bottom of the optical glass 80.

Although not described with reference to separate drawings, the radiation-resistant passivation layer 85 may be attached to not only the internal space of the package between the optical glass 80 and the image sensor 10, but also the top of the optical glass. The passivation layer 85 in accordance with one embodiment of the present disclosure may be fabricated of a material capable of blocking or reducing radiation. Examples of the material may include tungsten, tungsten compound, lead or combinations thereof. The passivation layer 85 may be attached to the top or bottom of the optical glass 80 by various suitable methods such as mechanical coupling, physical/chemical deposition, and bonding through epoxy region or the like, and the bonding method is not limited to a specific bonding method.

The image sensor package structure in accordance with one embodiment of the present disclosure can protect the peripheral circuit region, in which transistors vulnerable to radiation are used, from the influence of radiation.

While various embodiments have been described above, it will be understood to those skilled in the art that embodiments described are by way of example only. Accordingly, the disclosure described herein should not be limited based on the described embodiments.

What is claimed is:

1. A radiation-resistant image sensor package comprising:
   a substrate;
   an image sensor disposed over the substrate;
   an optical cover disposed over the image sensor;
   a circuit board comprising a first area where the circuit board overlaps with the substrate and a second area where the circuit board does not overlap with the substrate; and
   a connector configured to connect with another circuit board,
   wherein a radiation-resistant passivation layer is coupled to the optical cover, and
   wherein a bottom surface of the circuit board is coupled with a top surface of the substrate in the first area, and the connector is provided on the bottom surface of the circuit board in the second area.

2. The radiation-resistant image sensor package of claim 1, wherein the image sensor comprises a light receiving pixel region having image sensor pixels arranged therein and a peripheral circuit region including circuits configured to generate image signals by processing electrical signals generated by the pixels, wherein the passivation layer is not provided on the top of the light receiving pixel region, but provided on at least a part of the top of the peripheral circuit region.

3. The radiation-resistant image sensor package of claim 2, wherein the region of the optical cover, where the radiation-resistant passivation layer is not provided, has a size larger than or equal to the size of the light receiving pixel region.

4. The radiation-resistant image sensor package of claim 1, wherein the radiation-resistant passivation layer is coupled to the top or bottom of the optical cover.

5. The radiation-resistant image sensor package of claim 1, wherein the radiation-resistant passivation layer comprises tungsten, tungsten compound, lead or combinations thereof, and is deposited or attached to the top or bottom of the optical cover.

6. The radiation-resistant image sensor package of claim 1, wherein the optical cover transmits light to the image sensor, and seals the space between the image sensor and the optical cover.

7. The radiation-resistant image sensor package of claim 1, wherein a metal pad formed on the circuit board and the image sensor are electrically connected to each other through a metal wire, the optical cover and the circuit board are coupled to each other through a support body, and the support body has a predetermine height such that the metal wire is not contacted with the optical cover.

8. The radiation-resistant image sensor package of claim 1, wherein the substrate comprises a metal.

9. The radiation-resistant image sensor package of claim 1, wherein the substrate and the circuit board comprise a pair of a hole and a cut-out matched with each other for coupling.

10. The radiation-resistant image sensor package of claim 1, wherein the another circuit board is configured to drive the image sensor.

11. The radiation-resistant image sensor package of claim 1, wherein the circuit board comprises a hollow portion, and the image sensor is disposed inside the hollow portion of the circuit board.

12. A semiconductor chip package having an internal space for housing a semiconductor chip disposed on a substrate, and comprising:
    an optical cover disposed over the semiconductor chip and configured to transmit light while sealing the internal space, wherein the optical cover comprises a first region which includes a material for preventing the influence of radiation and a second region which does not include the material;
    a circuit board comprising a first area where the circuit board overlaps with the substrate and a second area where the circuit board does not overlap with the substrate; and
    a connector configured to connect with another circuit board,
    wherein a bottom surface of the circuit board is coupled with a top surface of the substrate in the first area, and the connector is provided on the bottom surface of the circuit board in the second area.

13. The semiconductor chip package of claim 12, wherein the material for preventing the influence of radiation comprises tungsten, tungsten compound or lead.

14. The semiconductor chip package of claim 12, wherein the second region has a larger area than a region of the semiconductor chip, which is designed to react to light.

15. The semiconductor chip package of claim 12, wherein the optical cover is optical glass.

* * * * *